United States Patent
Chen

(10) Patent No.: US 10,388,627 B1
(45) Date of Patent: Aug. 20, 2019

(54) MICRO-BONDING STRUCTURE AND METHOD OF FORMING THE SAME

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/371,144

(22) Filed: Apr. 1, 2019

Related U.S. Application Data

(63) Continuation-in-part of application No. 16/043,147, filed on Jul. 23, 2018, now Pat. No. 10,347,602.

(51) Int. Cl.
*H01L 23/00* (2006.01)
*H01L 33/62* (2010.01)
*H01L 33/52* (2010.01)

(52) U.S. Cl.
CPC .............. *H01L 24/83* (2013.01); *H01L 24/27* (2013.01); *H01L 24/32* (2013.01); *H01L 33/52* (2013.01); *H01L 33/62* (2013.01); *H01L 2224/29082* (2013.01); *H01L 2224/29109* (2013.01); *H01L 2224/29111* (2013.01); *H01L 2224/29147* (2013.01); *H01L 2224/29166* (2013.01);
(Continued)

(58) Field of Classification Search
CPC ......... H01L 23/49838; H01L 23/49811; H01L 24/83; H01L 24/29; H01L 24/27; H01L 24/32; H01L 33/62; H01L 25/0753; H01L 23/49866
See application file for complete search history.

(56) References Cited

U.S. PATENT DOCUMENTS 6,319,810 B1 * 11/2001 Ochiai ................. B23K 3/0623
257/E21.508
6,657,707 B1 * 12/2003 Morken .................. H01L 24/75
356/36

(Continued)

FOREIGN PATENT DOCUMENTS

EP 2023384 A1 2/2009
KR 20130142630 A 12/2013

OTHER PUBLICATIONS

Z. Mei et al., "Analysis of Low-Temperature Intermetallic Growth in Copper-Tin Diffusion Couples", Metallurgical transactions A, vol. 23A, Mar. 1992, p. 857-864.

(Continued)

*Primary Examiner* — Earl N Taylor
(74) *Attorney, Agent, or Firm* — CKC & Partners Co., LLC

(57) ABSTRACT

A micro-bonding structure including a substrate, a conductive pad, a bonding layer, a micro device, and a diffusive bonding portion is provided. The conductive pad is on the substrate. The bonding layer is on the conductive pad. A thickness of the bonding layer ranges from about 0.2 μm to about 2 μm. The micro device is on the bonding layer. The diffusive bonding portion is between and electrically connected with the bonding layer and the conductive pad. The diffusive bonding portion consists of at least a part of elements from the bonding layer and at least a part of elements from the conductive pad. A plurality of voids are between the bonding layer and the conductive pad, and one of the voids is bounded by the diffusive bonding portion and at least one of the conductive pad and the bonding layer.

19 Claims, 9 Drawing Sheets

(52) U.S. Cl.
CPC ............... *H01L 2224/29184* (2013.01); *H01L 2224/32227* (2013.01); *H01L 2224/83065* (2013.01); *H01L 2224/8382* (2013.01); *H01L 2224/83201* (2013.01); *H01L 2224/83359* (2013.01); *H01L 2224/83409* (2013.01); *H01L 2224/83411* (2013.01); *H01L 2224/83447* (2013.01); *H01L 2224/83466* (2013.01); *H01L 2924/2064* (2013.01); *H01L 2924/20105* (2013.01); *H01L 2933/0066* (2013.01)

(56) References Cited

U.S. PATENT DOCUMENTS

| | | | | |
|---|---|---|---|---|
| 7,170,172 | B2* | 1/2007 | Tomimori | H01L 24/03 257/739 |
| 7,601,625 | B2* | 10/2009 | Noritake | H01L 24/29 257/E21.51 |
| 8,517,249 | B2* | 8/2013 | Choi | B23K 1/0016 228/254 |
| 9,373,578 | B2* | 6/2016 | Choi | H01L 21/565 |
| 9,520,370 | B2* | 12/2016 | Gandhi | H01L 24/03 |
| 9,543,273 | B2* | 1/2017 | Gruber | H01L 25/0657 |
| 9,620,466 | B1* | 4/2017 | Mischitz | H01L 24/03 |
| 9,679,875 | B2* | 6/2017 | Gruber | H01L 25/0657 |
| 9,741,878 | B2* | 8/2017 | Hardin | C09D 5/24 |
| 9,847,310 | B2* | 12/2017 | Seddon | H01L 24/17 |
| 2004/0235266 | A1* | 11/2004 | Tong | B81C 1/00357 438/455 |
| 2005/0067699 | A1* | 3/2005 | Leong | H01L 23/49816 257/737 |
| 2005/0275096 | A1* | 12/2005 | Zeng | B23K 35/262 257/737 |
| 2006/0267157 | A1* | 11/2006 | Edwards | H01L 21/4846 257/646 |
| 2009/0096100 | A1* | 4/2009 | Kajiwara | H01L 23/49513 257/741 |
| 2009/0134016 | A1* | 5/2009 | Belanger | C22C 19/03 204/192.25 |
| 2009/0174052 | A1* | 7/2009 | Sogawa | H01L 23/24 257/690 |
| 2009/0184411 | A1* | 7/2009 | Chung | H01L 24/03 257/691 |
| 2009/0297879 | A1* | 12/2009 | Zeng | H01L 24/03 428/647 |
| 2011/0089567 | A1* | 4/2011 | Ishikawa | B23K 35/262 257/772 |
| 2011/0121464 | A1* | 5/2011 | Pendse | H01L 21/563 257/775 |
| 2011/0193227 | A1* | 8/2011 | Chuang | H01L 23/49866 257/738 |
| 2011/0290863 | A1* | 12/2011 | Kajiwara | B22F 3/22 228/227 |
| 2013/0037940 | A1* | 2/2013 | Chen | C23C 28/021 257/737 |
| 2013/0153646 | A1* | 6/2013 | Ho | B23K 1/0016 228/256 |
| 2014/0112363 | A1* | 4/2014 | Feitisch | B23K 20/023 372/43.01 |
| 2014/0124920 | A1* | 5/2014 | Chuang | H01L 24/11 257/737 |
| 2014/0126955 | A1* | 5/2014 | Ho | B23K 35/24 403/272 |
| 2014/0145328 | A1* | 5/2014 | Tummala | H01L 24/05 257/737 |
| 2014/0231996 | A1* | 8/2014 | Fujisawa | H01L 23/49811 257/746 |
| 2015/0072165 | A1* | 3/2015 | Sunaga | B23K 1/20 428/610 |
| 2015/0091162 | A1* | 4/2015 | Murayama | H01L 24/17 257/737 |
| 2015/0194409 | A1* | 7/2015 | Chuang | H01L 25/0657 257/737 |
| 2015/0340328 | A1* | 11/2015 | Gandhi | H01L 24/03 257/762 |
| 2016/0211242 | A1* | 7/2016 | Gruber | H01L 25/0657 |
| 2016/0240501 | A1* | 8/2016 | Gruber | H01L 25/0657 |
| 2016/0260677 | A1* | 9/2016 | Hsiao | H01L 24/13 |
| 2017/0047307 | A1* | 2/2017 | Uzoh | H01L 24/81 |
| 2017/0232562 | A1* | 8/2017 | Maeno | B23K 35/26 228/262.61 |
| 2017/0263585 | A1* | 9/2017 | Homma | H01L 24/16 |
| 2017/0263586 | A1* | 9/2017 | Joshi | H01L 24/83 |
| 2017/0282287 | A1* | 10/2017 | Larsson | B23K 20/02 |
| 2019/0013285 | A1* | 1/2019 | Murayama | H01L 24/11 |

OTHER PUBLICATIONS

Yu et al., "Effect of deposit thickness during electroplating on Kirkendall voiding at Sn/Cu joints", Materials Letters, vol. 128, 2014, pp. 9-1 1 (Year: 2014).

Yu et al., "Fine grained Cu film promoting Kirkendall voiding at Cu3Sn/Cu interface", Journal of Alloys and Compounds, vol. 660, 2016, pp. 80-84 (Year: 2016).

Tsai et al., "Effect of Sn concentration on massive spalling in high-Pb soldering reaction with Cu substrate", J. Mater. Res., vol. 24, No. 11, 2009, pp. 3407-3411 (Year:2009).

Teo et al., "Spalling behavior of interfacial intermetallic compounds in Pb-free solder joints subjected to temperature cycling loading", , Acta Materialia, vol. 56, 2008, pp. 242-249 (Year: 2008).

Subramanian, Lead-Free Electronic Solders A Special Issue of the Journal of Materials Science: Materials in Electronics, Springer Science+Business Media, LLC, 2007, 370 Pages (Year: 2007).

Ouyang et al., "Electromigration induced failure on lead-free micro bumps in three-dimensional integrated circuits packaging", Journal of Applied Physics, 112, 023505, 2012, pp. 1-5 (Year: 2012).

Orii et al., "Micro Structure Observation and Reliability Behavior of Peripheral Flip Chip Interconnections with Solder-Capped Cu Pillar Bumps", Transactions of The Japan Institute of Electronics Packaging, vol. 4, No. 1, 2011, pp. 73-86 (Year: 2011).

Li et al., "Joule heating induced thermomigration failure in unpowered microbumps due to thermal crosstalk in 2.5D IC technology", Journal ofApplied Physics, 120, 075105, 2016, pp. 1-10 (Year: 2016).

Kim et al., "Mechanism of void formation in Cu post solder joint under electromigration," 2015 IEEE 65th Electronic Components and Technology Conference (ECTC), San Diego, CA, 2015, pp. 135-141. (Year: 2015).

Park et al., "Effect of Cu—Sn intermetallic compound reactions on the Kirkendall void growth characteristics in Cu/Sn/Cu microbumps", Japanese Journal of Applied Physics, 53, 05HA06, 2014, pp. 1-4 (Year:2014).

Kim et al., "Micro void growth in NiSnP layer between (Cu,Ni)6Sn5 intermetallic compound and Ni3P by higher reflow temperature and multiple reflow", J Mater Sci: Mater Electron, 21, 2010, pp. 1337-1345 (Year: 2010).

Kim et al., "Formation and behavior of Kirkendall voids within intermetallic layers of solder joints", J Mater Sci: Mater Electron, 22, 2011, pp. 703-716 (Year: 2011).

Juang et al., "Development of 30 um pitch Cu/Ni/SnAg microbump-bonded chip-on-chip (COC) interconnects," 2010 5th International Microsystems Packaging Assembly and Circuits Technology Conference, Taipei, 2010, pp. 1-4. (Year: 2010).

Borgensen et al., "Acceleration of the growth of Cu3Sn voids in solder joints", Microelectronics Reliability, vol. 52, Issue 6, 2012, pp. 1121-1127 (Year:2012).

Ross et al., "Void formation and its impact on CuSn intermetallic compound formation", Journal of Alloys and Compounds, vol. 677, 2016, pp. 127-138 (Year:2016).

* cited by examiner

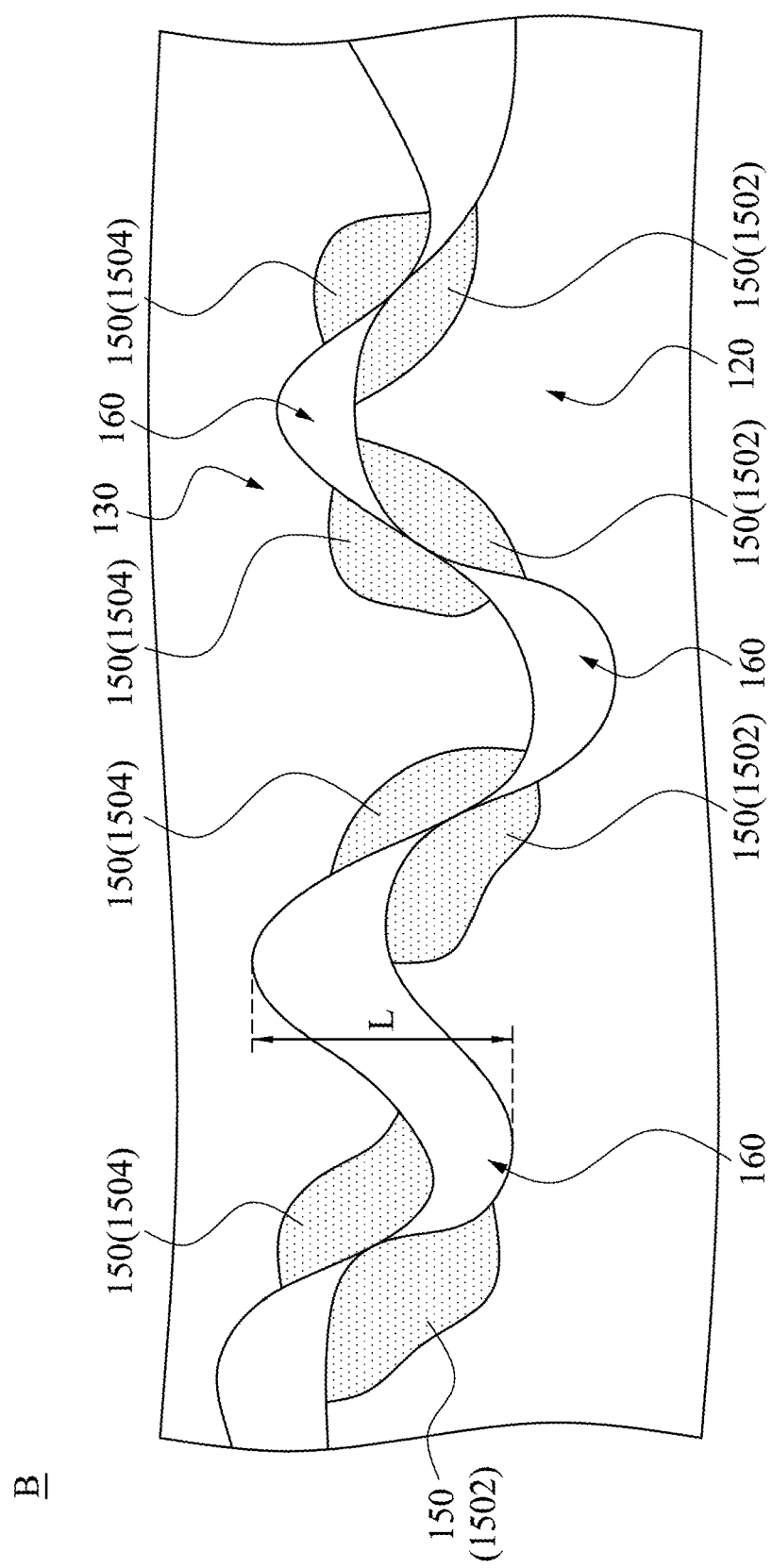

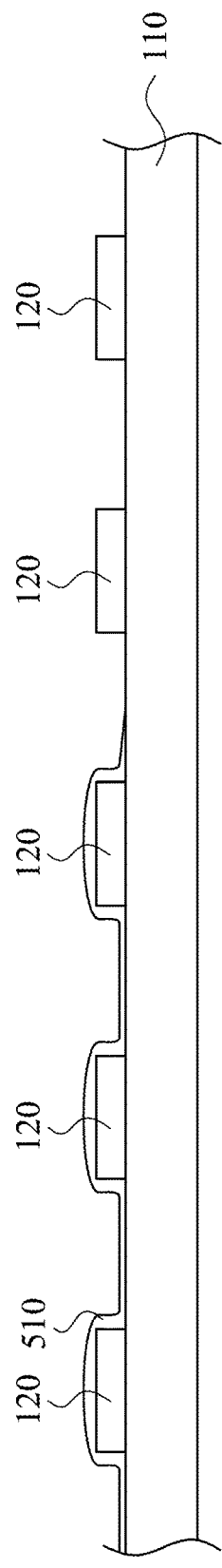
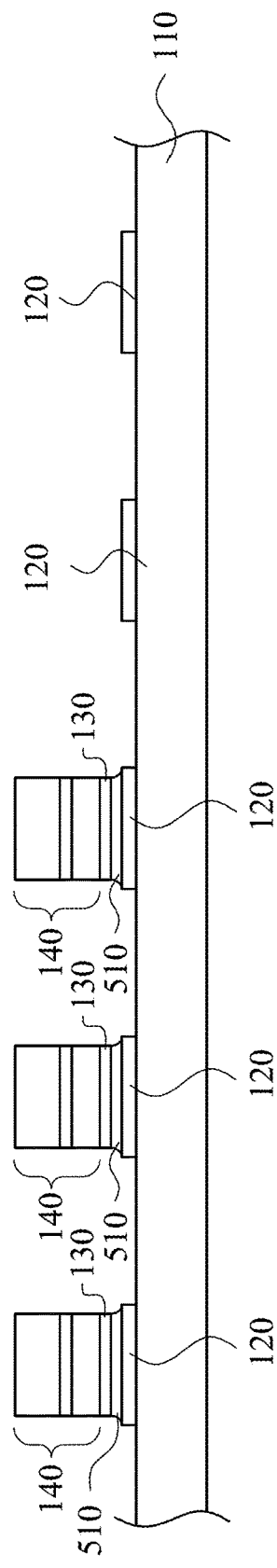

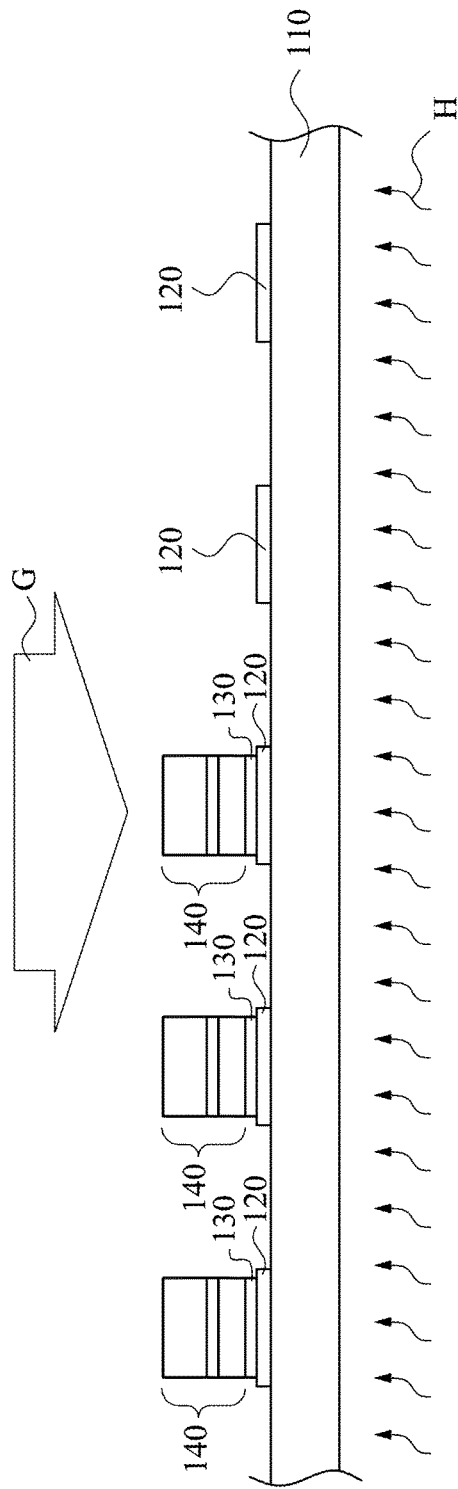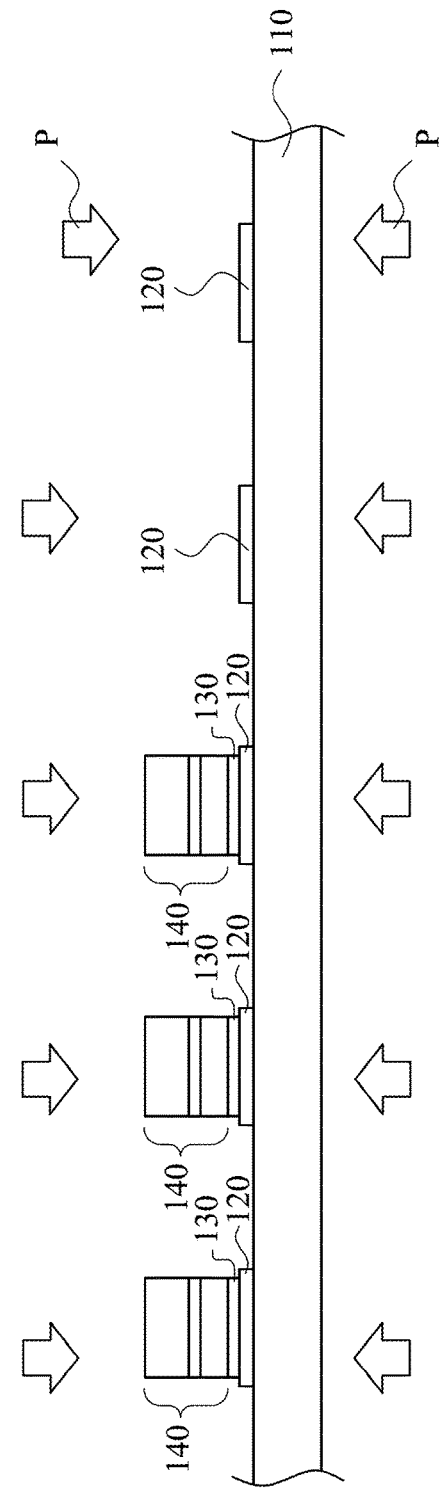

MICRO-BONDING STRUCTURE AND METHOD OF FORMING THE SAME

RELATED APPLICATIONS

The present application is a continuation-in-part application of U.S. application Ser. No. 16/043,147, filed Jul. 23, 2018 which is herein incorporated by reference.

BACKGROUND

Field of Invention

The present disclosure relates to a micro-bonding structure and a method of forming the micro-bonding structure.

Description of Related Art

The statements in this section merely provide background information related to the present disclosure and do not necessarily constitute prior art.

In recent years, micro devices have become popular in various applications. Among all technical aspects of micro devices, transfer process is one of the most challenging tasks for micro devices to be commercialized. One of the important issues of the transfer process is bonding the micro devices to a substrate.

SUMMARY

According to some embodiments of the present disclosure, a micro-bonding structure including a substrate, a conductive pad, a bonding layer, a micro device, and a diffusive bonding portion is provided. The conductive pad is on the substrate. The bonding layer is on the conductive pad. The micro device is on the bonding layer. A thickness of the bonding layer ranges from about 0.2 µm to about 2 µm. The diffusive bonding portion is between and electrically connected with the bonding layer and the conductive pad. The diffusive bonding portion consists of at least a part of elements from the bonding layer and at least a part of elements from the conductive pad. A plurality of voids are between the bonding layer and the conductive pad, and one of the voids is bounded by the diffusive bonding portion and at least one of the conductive pad and the bonding layer.

According to some embodiments of the present disclosure, a method of forming a micro-bonding structure is provided. The method includes: forming a bonding layer on the micro device, wherein a thickness of the bonding layer ranges from about 0.2 µm to about 2 µm; preparing the substrate with a conductive pad thereon; forming a liquid layer on the conductive pad; placing the micro device over the substrate and contacting the micro device with the liquid layer; and heating at least one of the bonding layer and the conductive pad to a temperature below a melting point of one of the bonding layer and the conductive pad having lower melting point with a heating rate less than or equal to 12 degree Celsius per minute to gradually evaporate the liquid layer, so that the bonding layer is in contact with the conductive pad to form a plurality of voids between the bonding layer and the conductive pad, and an interstitial diffusion occurs between the bonding layer and the conductive pad to form a diffusive bonding portion.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 2A is an enlarged cross-sectional view of a portion of a micro-bonding portion as indicated in FIG. 1 according to some embodiments of the present disclosure;

FIG. 5A is a schematic cross-sectional view of one of intermediate steps of the method of FIG. 4 according to some embodiments of the present disclosure;

FIG. 5B is a schematic cross-sectional view of one of intermediate steps of the method of FIG. 4 according to some embodiments of the present disclosure;

FIG. 5C is a schematic cross-sectional view of one of intermediate steps of the method of FIG. 4 according to some embodiments of the present disclosure; and FIG. 5D is a schematic cross-sectional view of an optional intermediate step of the method according to some embodiments of the present disclosure.

DETAILED DESCRIPTION

Figure 1:
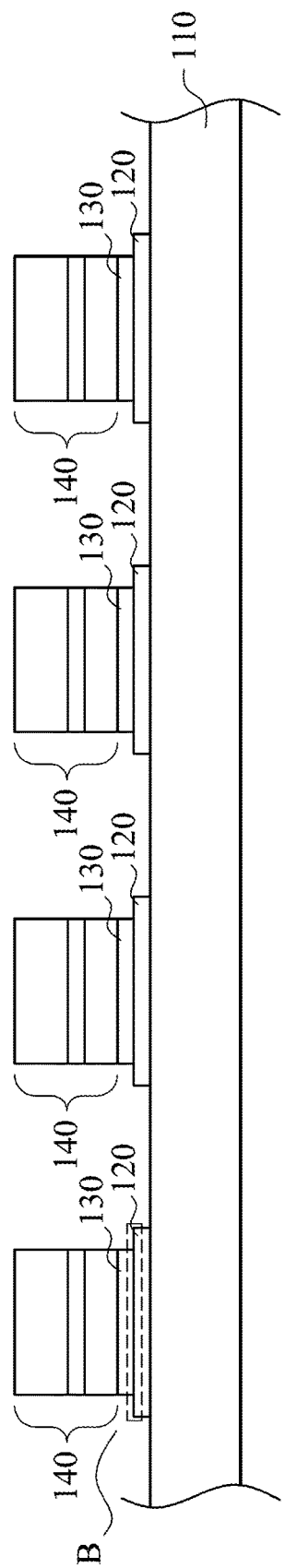
FIG. 1 is a schematic cross-sectional view of a micro-bonding structure according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 2B:
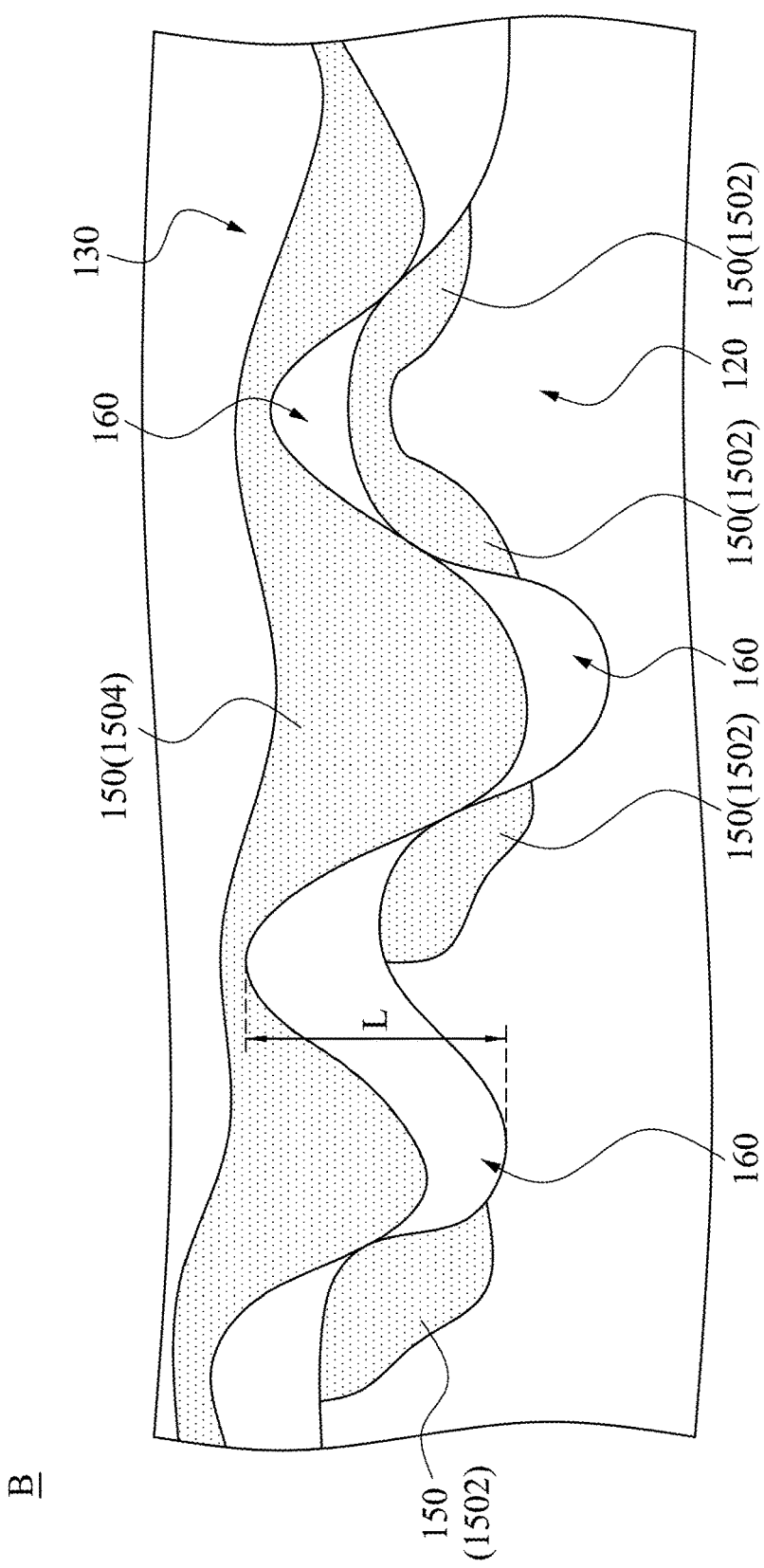
FIG. 2B is an enlarged cross-sectional view of a portion of the micro-bonding portion as indicated in FIG. 1 according to some embodiments of the present disclosure.
Figure 2C:
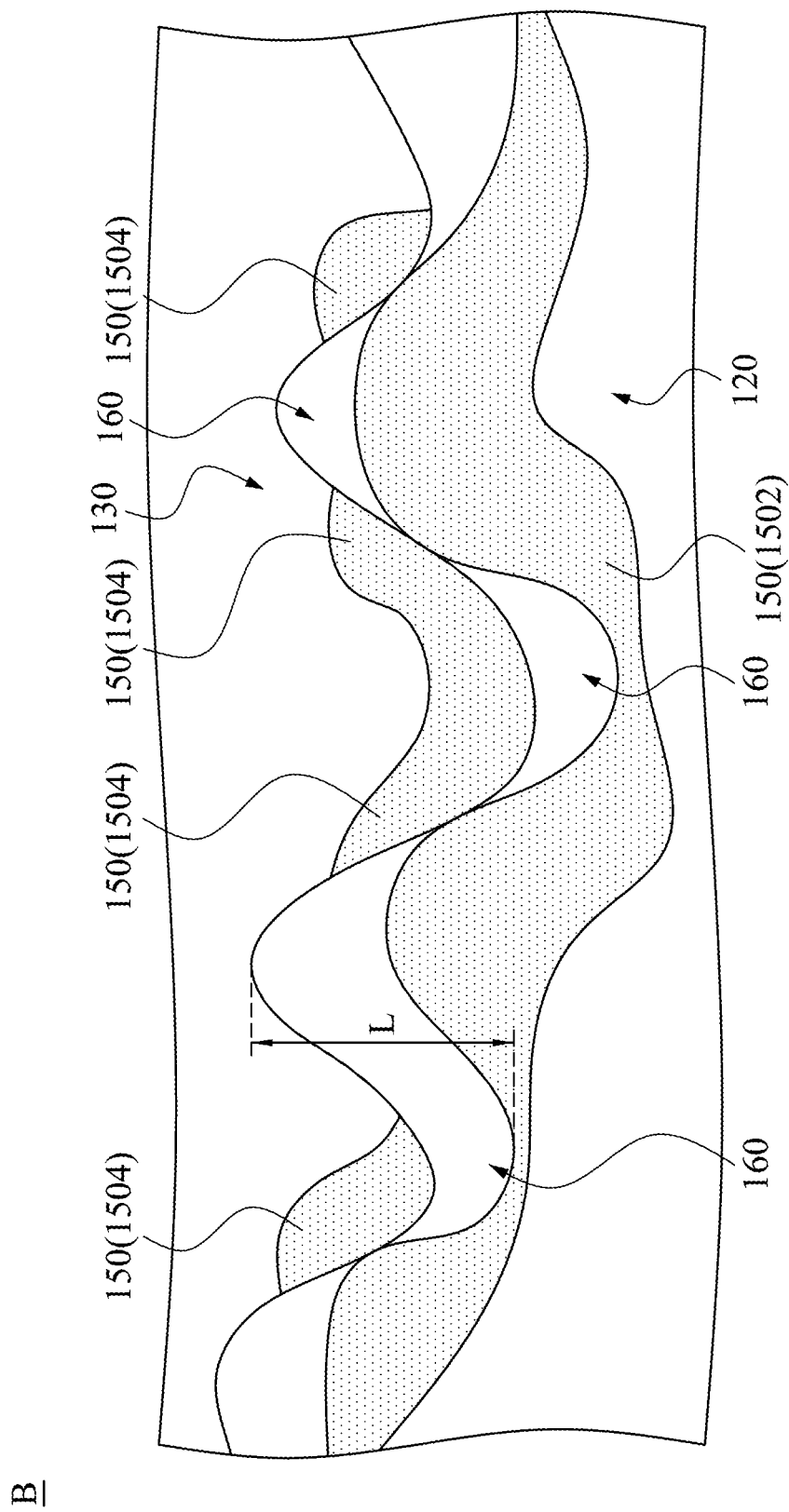
FIG. 2C is an enlarged cross-sectional view of a portion of the micro-bonding portion as indicated in FIG. 1 according to some embodiments of the present disclosure.

In one aspect, a micro-bonding structure 100 is provided. Although most of terms described in the following disclosure use singular nouns, said terms may also be plural in accordance with figures or practical applications. Reference is made to FIGS. 1, and 2A to 2C. FIG. 1 is a schematic cross-sectional view of a micro-bonding structure 100 according to some embodiments of the present disclosure. FIG. 2A is an enlarged cross-sectional view of a portion of a micro-bonding portion B as indicated in FIG. 1 according to some embodiments of the present disclosure. FIG. 2B is an enlarged cross-sectional view of a portion of a micro-bonding portion B as indicated in FIG. 1 according to some embodiments of the present disclosure. FIG. 2C is an enlarged cross-sectional view of a portion of the micro-bonding portion as indicated in FIG. 1 according to some embodiments of the present disclosure. In some embodiments, a micro-bonding structure 100 including a substrate 110, a conductive pad 120, a bonding layer 130, a micro device 140, and a diffusive bonding portion 150 is provided. The conductive pad 120 is on the substrate 110. The bonding layer 130 is on the conductive pad 120. The micro device 140 is on the bonding layer 130. The diffusive bonding portion 150 is between and electrically connected with the bonding layer 130 and the conductive pad 120.

In some embodiments, one of the conductive pad 120 and the bonding layer 130 includes one of copper (Cu), tin (Sn), titanium (Ti), and indium (In), and said one of Cu, Sn, Ti, and In accounts for more than half of a number of atoms of said one of the conductive pad 120 and the bonding layer 130. In some embodiments, the conductive pad 120 includes a noble metal, and the noble metal accounts for more than half of a number of atoms of the conductive pad 120. The noble metal may include copper (Cu), but should not be limited thereto. Other noble metals are also within the scope of the present disclosure, such as ruthenium (Ru), rhodium (Rh), palladium (Pd), silver (Ag), platinum (Pt), and gold (Au). In some embodiments, the conductive pad 120 includes nickel (Ni). In some embodiments, the conductive pad 120 includes a combination of copper (Cu) and nickel (Ni), and Cu accounts for more than half of a number of atoms of the conductive pad 120. Whether a material is the main material of the conductive pad 120 can be determined by whether the diffusion coefficient of a diffusion from said material (e.g., Cu) to another material of the bonding layer 130 in contact therewith is high enough (e.g., equal to or greater than the order of about $10^{-13}$ $(m^2/s)$ at 190 degrees Celsius), but should not be limited thereto.

In some embodiments, the bonding layer 130 includes a solder material, and the solder material accounts for more than half of a number of atoms of the bonding layer 130. The solder material may include tin (Sn), lead (Pb), bismuth (Bi), a combination of Sn and Pb, a combination of Sn and Bi, a combination of Bi and Pb, or a combination of Sn, Pb, and Pb, but should not be limited thereto. In some embodiments, Sn accounts for more than half of a number of atoms of the bonding layer 130. In some embodiments, a surface roughness of one of the conductive pad 120 and the bonding layer 130 is less than or equal to 80 nm. In some embodiments, the diffusion coefficient of a diffusion from the conductive pad 120 to the bonding layer 130 is greater than a diffusion coefficient of a diffusion from the bonding layer 130 to the conductive pad 120, so that atoms of the diffusion from the conductive pad 120 to the bonding layer 130 is more than atoms of the diffusion from the bonding layer 130 to the conductive pad 120. For example, a diffusion coefficient of a diffusion from Cu to Sn is about $4.49 \times 10^{-11}$ $(m^2/s)$ at 190 degrees Celsius, while a diffusion coefficient of a diffusion from Sn to Cu is about $3.10 \times 10^{-25}$ $(m^2/s)$ at 190 degrees Celsius (e.g., referred to Table I of Z. Mei, A. J. Sunwoo and J. W. Morris, Jr., *Metall. Trans. A* 23A, 857 (1992)). Therefore, Cu is more likely to diffuse into Sn through an interstitial diffusion. Although the interstitial diffusion may be a dominant diffusion mechanism for a diffusion from Cu to Sn, other diffusion mechanisms such as a vacancy diffusion may also occur (e.g., diffusion of Sn into Cu vacancies, but should not be limited thereto, wherein Cu vacancies are caused by said interstitial diffusion).

Enlarged views of a portion of the micro-bonding portion B in FIG. 1 are shown in FIGS. 2A, 2B, and 2C. The diffusive bonding portion 150 is between and is electrically connected with the bonding layer 130 and the conductive pad 120. The diffusive bonding portion 150 consists of at least a part of elements from the bonding layer 130 and at least a part of elements from the conductive pad 120. A plurality of voids 160 are between the bonding layer 130 and the conductive pad 120, and one of the voids 160 is bounded by the diffusive bonding portion 150 and at least one of the conductive pad 120 and the bonding layer 130.

In some embodiments, the diffusive bonding portion 150 has a first part 1502 and a second part 1504 respectively in contact with the conductive pad 120 and the bonding layer 130. In some embodiments, a volume of the second part 1504 is greater than a volume of the first part 1502. In some embodiments, a volume of the second part 1504 is equal to a volume of the first part 1502. In some embodiments, a volume of the second part 1504 is less than a volume of the first part 1502. Different volumes between the first part 1502 and the second part 1504 may be due to different diffusion coefficients of the diffusion from the conductive pad 120 to the bonding layer 130 and the diffusion from the bonding layer 130 to the conductive pad 120, but should not be limited thereto.

In some embodiments, the voids 160 are bounded by a part of a periphery of the diffusive bonding portion 150, a part of a periphery of the conductive pad 120 facing the bonding layer 130, and a part of a periphery of the bonding layer 130 facing the conductive pad 120 (e.g., referred to FIG. 2A). In some embodiments, at least one of the voids 160 is bounded by a part of a periphery of the diffusive bonding portion 150 and a part of a periphery of the conductive pad 120, but is not directly bounded by any part of a periphery of the bonding layer 130 (e.g., referred to FIG. 2B). In some embodiments, at least one of the voids 160 is bounded by a part of a periphery of the diffusive bonding portion 150 and a part of a periphery of the bonding layer 130, but is not directly bounded by any part of a periphery of the conductive pad 120 (e.g., referred to FIG. 2C). The difference between the embodiments illustrated by FIGS. 2A, 2B, and 2C may be due to a time duration of heating, an end point temperature during the heating, or a difference of diffusion coefficients of selected materials, but should not be limited thereto. In some embodiments, a vertical length L of one of the voids 160 is less than or equal to 200 nm. The definition of the vertical length L indicated in FIGS. 2A to 2C is a length of one of the voids 160 perpendicular to an extension direction of a surface of the conductive pad 120 in contact with the bonding layer 130 from a macroscopic (e.g., FIG. 1) point of view. In some embodiments, the structural features mentioned above in the present and the previous two paragraphs can be performed by first forming a liquid layer on the conductive pad 120 and contacting the bonding layer 130 with the liquid layer, and then heating at least one of the conductive pad 120 and the bonding layer 130 to a temperature below the melting point of Sn to cause an evaporation of the liquid layer and to prevent melting of Sn. After the evaporation, the bonding layer 130 is bound to and in electrical contact with the conductive pad 120, so as to form said structural features. Detailed method and parameters of said heating will be shown later in the present description.

In some embodiments, a thickness of the conductive pad 120 is less than or equal to 2 μm. In some embodiments, the thickness of the conductive pad 120 is less than or equal to 0.5 μm. In some embodiments, a thickness of the bonding layer 130 ranges from about 0.2 μm to about 2 μm. In some embodiments, the thickness of the bonding layer 130 preferably ranges from about 0.3 μm to about 1 μm. The considerations of a lowest limit of the thicknesses of the conductive pad 120 and the bonding layer 130 is to ensure that enough spaces are present for the interstitial diffusion between the solder material and the noble metal (and/or Ni). The thicknesses described herein are maximum lengths of the element (e.g., the bonding layer 130, or the conductive pad 120) perpendicular to the extending direction of the substrate 110 in said cross sectional views of the figures. Besides, the bonding layer 130 shall be thin enough (i.e., less than 2 μm and preferably less than 1 μm) to lower a thermal conductivity thereof so as to perform better heat dissipation for the micro-bonding structure 100. In addition, an ability to resist damages caused by a shear stress applied to the bonding layer 130 or the micro-bonding structure 100 is enough to avoid the micro-bonding structure suffering from damages. Furthermore, since the thickness of the bonding layer 130 is much thinner than conventional layers for use of bonding (e.g., conventional welding), a resistance of the bonding layer 130 is reduced with a significant amount such that an energy consumption for operating the micro device 140 bonded on the bonding layer 130 can be reduced.

Figure 3A:
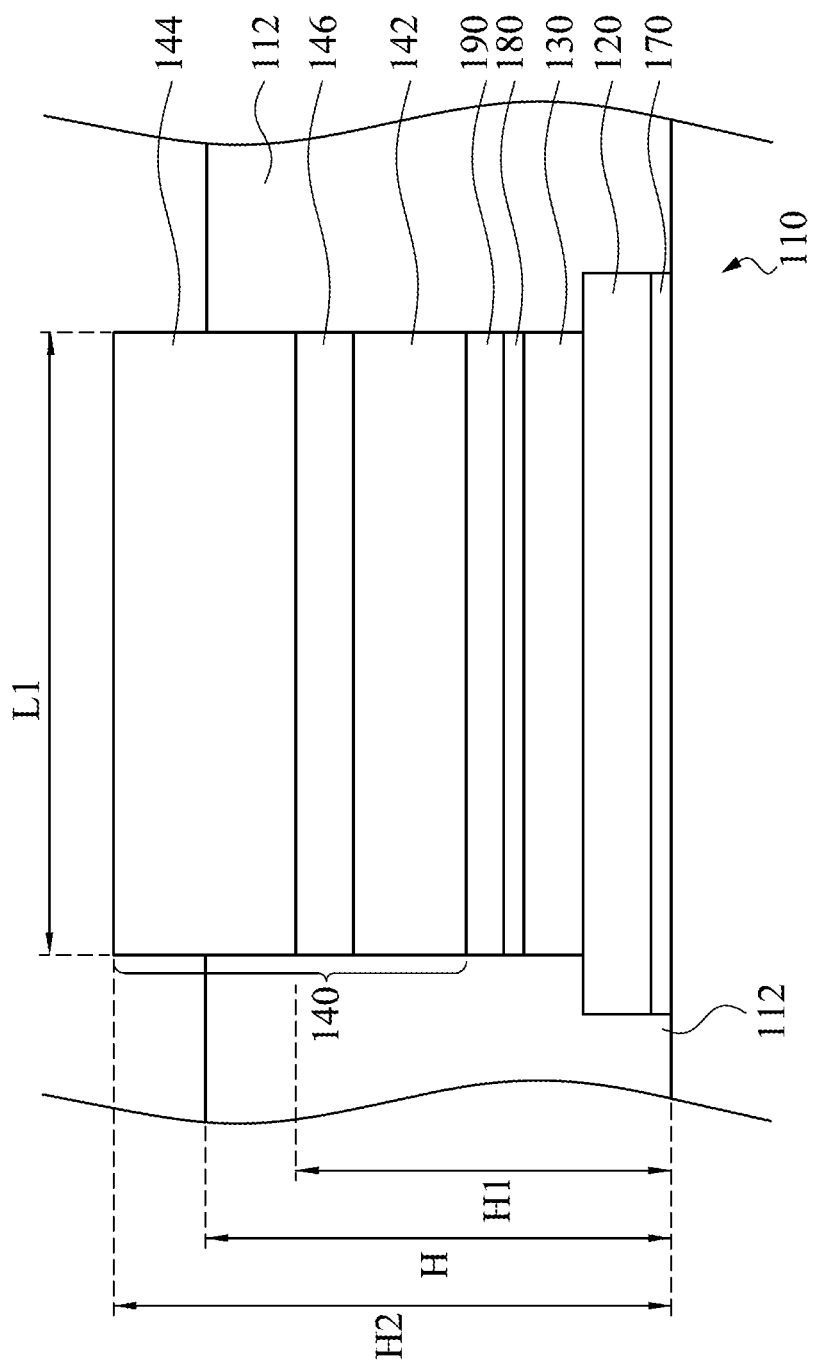
FIG. 3A is a schematic cross-sectional view of an enlarged view which focuses on one micro device and a portion of the substrate where the micro device is bonded thereon according to some embodiments of the present disclosure.
Figure 3B:
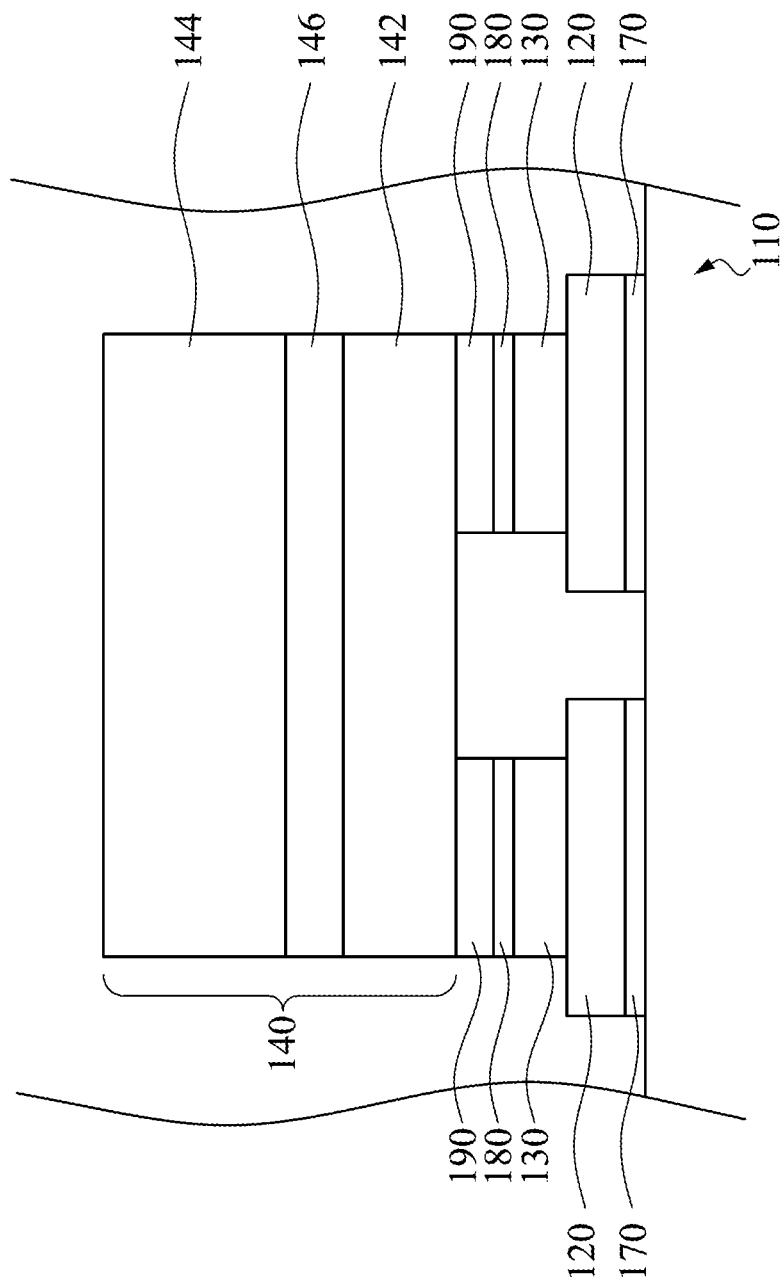
FIG. 3B is a schematic cross-sectional view of an enlarged view which focuses on one micro device and a portion of the substrate where the micro device is bonded thereon according to some embodiments of the present disclosure.

Reference is made to FIGS. 3A and 3B. FIG. 3A is a schematic cross-sectional view of an enlarged view which focuses on one micro device 140 and a portion of the substrate 110 where the micro device 140 is bonded thereon according to some embodiments of the present disclosure. The micro device 140 can include a first type semiconductor layer 142, a second type semiconductor layer 144 on the first type semiconductor layer 142, and an active layer 146 between and in contact with the first type semiconductor layer 142 and the second type semiconductor layer 144. The first and second type semiconductor layers 142, 144 can be p-type and n-type semiconductor layers respectively, and the active layer 146 can be a quantum well or a multiple quantum well, but should not be limited thereto. In some embodiments, the first type semiconductor layer 142 (e.g., a p-type semiconductor layer) is thinner than the second type semiconductor layer 144 (e.g., an n-type semiconductor layer), and the first type semiconductor layer 142 of the micro device 140 faces the substrate 110. Under this configuration, a thickness of a filling material 112 (e.g., a dielectric material) optionally present as shown in FIG. 3A to fill an empty space and exposes at least a portion of the second type semiconductor layer 144 can have a larger range of tolerance. The reason is that one of functions of the filling material 112 is to prevent a current shortage between the first type semiconductor layer 142 and the second type semiconductor layer 144. Therefore, a height H of the filling material 112 relative to the substrate 110 may be greater than a height H1 of the active layer 146 relative to the substrate 110 but smaller than a height H2 of the micro device 140 relative to the substrate 110 as indicated in FIG. 3A. As a result, the larger range of tolerance of the height H is allowed for the configuration that the first type semiconductor layer 142 of the micro device 140 faces the substrate 110 (i.e., p-side down). Specifically, the filling material 112 is on the substrate 110 and is in contact with the conductive pad 120, the bonding layer 130, and the micro device 140. Furthermore, since a carrier concentration of the p-type semiconductor layer is lower than a carrier concentration of the n-type semiconductor layer, thinner p-type semiconductor layer can enhance efficiency of the micro device 140 (e.g., a micro light-emitting diode). In some embodiments, the height H2 of the micro device 140 relative to the substrate 110 is smaller than a lateral length L1 of the micro device 140 as indicated in FIG. 3A so as to further enhance the ability to resist damages caused by the shear stress applied to the micro-bonding structure 100. In general, the lateral length L1 of the micro device 140 is measured in a direction perpendicular to the height H2.

In some embodiments, a lateral length of the micro device 140 is equal to or smaller than 50 μm. In some embodiments, the lateral length of the micro device 140 is equal to or smaller than 20 μm. The lateral lengths described herein are maximum lengths of the micro device 140 parallel to an extending direction of the substrate 110 in a side (cross-sectional) view as shown in FIGS. 1, 3A, and 3B. In some embodiments, an area of the conductive pad 120 which is used to be in contact with the bonding layer 130 is less than or equal to 2500 μm$^2$, such as a 50 μm×50 μm square area, but should not be limited thereto. Since a bonding between the bonding layer 130 and the conductive pad 120 is mainly performed by an interstitial diffusion between the solder material and the noble metal (and/or Ni) at a temperature below the melting point of Sn, a location accuracy of the micro device 140 on the substrate 110 does not deteriorate since the solder material (e.g., Sn) is not melted. Besides, qualities of the micro device 140 and other components (e.g. circuits) on the substrate 110 are maintained after said bonding due to said temperature which is lower than a conventional bonding temperature.

It should be noted that, said interstitial diffusion with an aid of the liquid layer works well for the purpose of bonding with a micro device 140 having a size (lateral length and/or thickness) less than about 50 μm. In other cases with a size of a device much larger than 50 μm (e.g., 100 μm), a conventional welding (e.g., melting Sn) should be performed for the bonding since a capillary force of the liquid layer is not able to hold the device within a controllable region, and said interstitial diffusion may not be able to firmly bond a bonding layer and a device to a conductive pad.

In some embodiments, the micro-bonding structure 100 further includes a first adhesive layer 170 between the conductive pad 120 and the substrate 110. The first adhesive layer 170 may include titanium (Ti), titanium tungsten (TiW), chromium (Cr), molybdenum (Mo), molybdenum titanium (MoTi), or combinations thereof, and should not be limited thereto. In some embodiments, the micro-bonding structure 100 further includes a second adhesive layer 180 between the micro device 140 and the bonding layer 130. The second adhesive layer 180 includes titanium (Ti), titanium tungsten (TiW), chromium (Cr), nickel (Ni), nickel chromium (NiCr), copper (Cu), molybdenum (Mo), molybdenum titanium (MoTi) or combinations thereof, and should not be limited thereto. The first and second adhesive layers 170, 180 can enhance qualities of bonding between the conductive pad 120 and the substrate 110 and between the micro device 140 and the bonding layer 130 respectively, so as to prevent separations during and after formation processes of the micro-bonding structure 100.

In some embodiments, the micro-bonding structure 100 further includes at least one electrode 190 between the bonding layer 130 (or the second adhesive layer 180) and the micro device 140 for an electrical contact between the micro device 140 and the conductive pad 120. The electrode 190 may include gold (Au), Silver (Ag), platinum (Pt), Cr/Au, Pt/Au, Ti/Pt/Au, Ti/Au, Ni/Au-zinc (Zn), Ni/Au, Ni/silicon (Si), Ni/Cr/Au, palladium (Pd)/Au, or tungsten silicon (WSi), but should not be limited thereto.

FIG. 3B is a schematic cross-sectional view of an enlarged view which focuses on one micro device 140 and a portion of the substrate 110 where the micro device 140 is bonded thereon according to some embodiments of the present disclosure. The difference between embodiments illustrated by FIGS. 3A and 3B is that, the bonding layer 130 is a patterned bonding layer including at least two isolated portions (e.g., left and right bonding layer 130 as shown in FIG. 3B), and the isolated portions are electrically isolated from one another. Moreover, the second adhesive layer 180, the electrode 190, the conductive pad 120, and the first adhesive layer 170 can also have at least two isolated portions respectively as shown in FIG. 3B.

Figure 4:
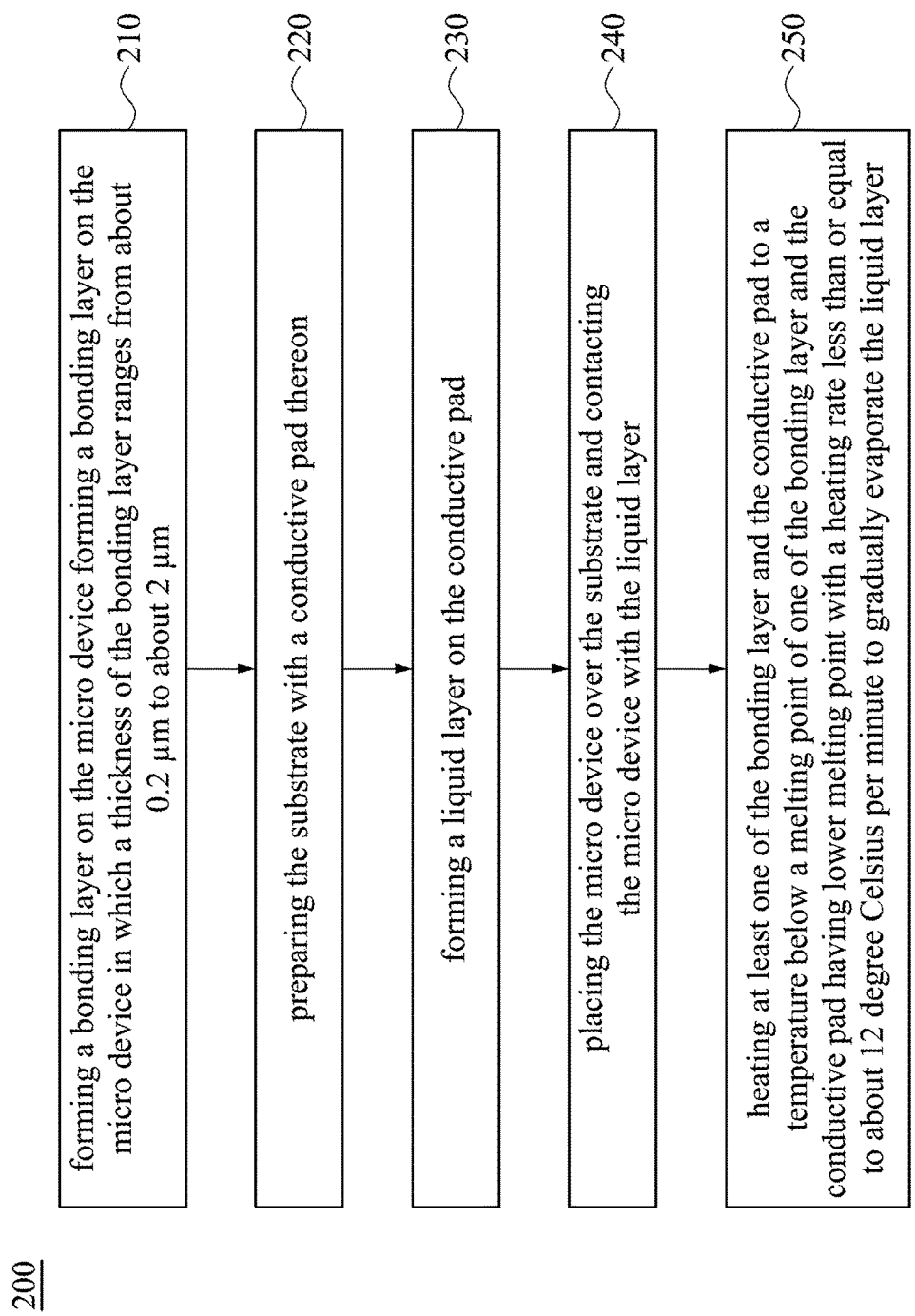
FIG. 4 is a schematic flow chart of a method for bonding a micro device to a substrate according to some embodiments of the present disclosure.

In another aspect, a method 200 of forming a micro bonding structure 100 is provided. Although most of terms described in the following disclosure use singular nouns, said terms may also be plural in accordance with figures or practical applications. It should be noted that, properties of elements or terms illustrated in previous few paragraphs related to the micro-bonding structure 100 can be applied to the following embodiments related to the method 200, and some of which will not be repeated herein for simplicity. Reference is made to FIGS. 1 to 5C. FIG. 4 is a schematic flow chart of a method 200 for bonding a micro device 140 to a substrate 110 according to some embodiments of the present disclosure. FIGS. 5A-5C each is a schematic cross-sectional view of one of intermediate steps of the method 200 of FIG. 4 according to some embodiments of the present disclosure. The method 200 begins with operation 210 in which a bonding layer 130 is formed on the micro device 140. A thickness of the bonding layer 130 ranges from about 0.2 µm to about 2 µm, and preferably ranges from about 0.3 µm to about 1 µm in some embodiments. The method 200 continues with operation 220 in which the substrate 110 is prepared with a conductive pad 120 thereon (e.g., referred to FIG. 5A). The method 200 continues with operation 230 in which a liquid layer 510 is formed on the conductive pad 120 (e.g., referred to FIG. 5A). The method 200 continues with operation 240 in which the micro device 140 is placed over the substrate 110 and is in contact with the liquid layer 510 (e.g., referred to FIG. 5B). The method 200 continues with operation 250 in which at least one of the bonding layer 130 and the conductive pad 120 is heated (as indicated by a heating process H shown in FIG. 5C) to a temperature below a melting point of one of the bonding layer 130 and the conductive pad 120 having lower melting point with a heating rate less than or equal to 12 degrees Celsius per minute to gradually evaporate the liquid layer 510 (e.g., referred to FIG. 5C).

Reference is made to FIGS. 5A and 5B. The liquid layer 510 is formed on the conductive pad 120. After the bonding layer 130 is formed on the micro device 140 and the conductive pad 120 is prepared on the substrate 110, the micro device 140 is placed over the substrate 110 and is in contact with the liquid layer 510, so that the micro device 140 is gripped by a capillary force produced by the liquid layer 510 and is substantially held in a position within a controllable region on the substrate 110. In some embodiments, the bonding layer 130 can be formed by electroless plating, electroplating, sputtering, thermal evaporating, or electron gun evaporating. In some embodiments, the first adhesive layer 170 is formed on the substrate 110, and then the conductive pad 120 is formed on the first adhesive layer 170. In some embodiments, the micro device 140 is prepared with at least one electrode 190 thereon, and the bonding layer 130 is formed on the electrode 190. In some embodiments, a second adhesive layer 180 is formed on the electrode 190, then the bonding layer 130 is formed on the second adhesive layer 180. The first and second adhesive layers 170, 180 may include titanium (Ti), tungsten titanium (TiW), but should not be limited thereto.

Reference is made to FIG. 5C. The bonding layer 130 and/or the conductive pad 120 is heated (as indicated by the heating process H shown in FIG. 5C) to a temperature below a melting point of one of the bonding layer 130 and the conductive pad 120 having lower melting point with a heating rate less than or equal to about 12 degrees Celsius per minute to gradually evaporate the liquid layer 510, so that the bonding layer 130 is in contact with the conductive pad 120 to form a plurality of voids 160 between the bonding layer 130 and the conductive pad 120 by a roughness of the bonding layer 130 and a roughness of the conductive pad 120. Said heating can drive away water in the liquid layer 510 so that a solid diffusion can occur between the bonding layer 130 and the conductive pad 120. In some embodiments, the heating rate is less than or equal to 10.33 degrees Celsius per minute. Said heating rate is determined in accordance with the feasibility of holding the micro device 140 within a controllable region. The heating rate shall be slow enough, otherwise the contact between the conductive pad 120 and the bonding layer 130 will be split apart due to a quick evaporation of the liquid layer 510. During said heating process H, the interstitial diffusion occurs between the bonding layer 130 and the conductive pad 120 to form a diffusive bonding portion 150. In some embodiments, the diffusive bonding portion 150 is formed within an environment with a reducing gas G (e.g., hydrogen, $H_2$) therein, so as to avoid oxidation. Said temperature (i.e., end point temperature) can be less than or equal to 200 degrees Celsius. In some embodiments, said temperature is about 180 degrees Celsius. In some embodiments, the interstitial diffusion is mainly a diffusion of a noble metal (and/or Ni) of the conductive pad 120 into a solder material of the bonding layer 130 since a diffusion coefficient of a diffusion from the noble metal (e.g., Cu) to the solder material (e.g., Sn) is higher than a diffusion coefficient of a diffusion from the solder material (e.g., Sn) to the noble metal (e.g., Cu). With the heating rate (e.g., 10.33 degrees Celsius per minute) and the temperature (e.g., 180 degrees Celsius) mentioned above, the conductive pad 120 and the bonding layer 130 do not melt on an interface therebetween during said interstitial diffusion. As a result, voids 160 formed upon contact between the conductive pad 120 and the bonding layer 130 is not filled during the heating process H. As such, said heating process H can provide a diffusive bonding portion 150 which is much thinner compared with known processes in which a eutectic bonding layer is formed by melting materials on an interface of two layers in contact. Materials which can be included by the noble metal and the solder material respectively have been mentioned before and will not be repeated again.

Reference is made to FIG. 5D. FIG. 5D is a schematic cross-sectional view of an optional intermediate step of the method 200 according to some embodiments of the present disclosure. In some embodiments, after the evaporation, an external pressure P is applied to the conductive pad 120 and the bonding layer 130. Specifically, in an environmental pressure which is 1 atmospheric pressure (atm), the external pressure P larger than or equal to about ¼ atm can be applied such that the conductive pad 120 and the bonding layer 130 is suffered from a compressive pressure which is larger than or equal to about 5/4 atm, and the bonding strength between the conductive pad 120 and the bonding layer 130 is further enhanced. Furthermore, the external pressure P can increase a diffusion rate between the conductive pad 120 and the bonding layer 130. In some embodiments, the external pressure P can be applied by varying the environmental pressure, such as varying a pressure of a chamber which contains the micro-bonding structure 100. In some embodiments, the external pressure P can be applied by a flat plate additionally placed on the micro devices 140.

In summary, embodiments of the present disclosure provide a micro-bonding structure and a method for bonding a micro device to a substrate at a temperature below the melting point of a soldering material, in which the micro device has a tiny lateral length (e.g. equal to or smaller than 50 μm) compared to that of a conventional device (e.g. a conventional LED die). Special features of voids are on an interface of a conductive pad and a bonding layer due to appropriate heating rate and an end point temperature of heating. As such, a solid bonding can be formed and qualities of the micro device and related circuits are maintained after said bonding.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A micro-bonding structure, comprising:
a substrate;
a conductive pad on the substrate;
a bonding layer on the conductive pad, wherein a thickness of the bonding layer ranges from about 0.2 μm to about 2 μm;
a micro device on the bonding layer; and
a diffusive bonding portion between and electrically connected with the bonding layer and the conductive pad, wherein the diffusive bonding portion consists of at least a part of elements from the bonding layer and at least a part of elements from the conductive pad, and a plurality of voids are between the bonding layer and the conductive pad, and one of the voids is bounded by the diffusive bonding portion and at least one of the conductive pad and the bonding layer.

2. The micro-bonding structure of claim 1, wherein the diffusive bonding portion is formed by heating at least one of the conductive pad and the bonding layer.

3. The micro-bonding structure of claim 1, wherein the diffusive bonding portion is formed by applying an external pressure to the conductive pad and the bonding layer.

4. The micro-bonding structure of claim 1, wherein the diffusive bonding portion is formed within an environment with a reducing gas therein.

5. The micro-bonding structure of claim 1, wherein one of the conductive pad and the bonding layer comprises one of copper, tin, titanium, and indium, and said one of copper, tin, titanium, and indium accounts for more than half of a number of atoms of said one of the conductive pad and the bonding layer.

6. The micro-bonding structure of claim 1, wherein a diffusion coefficient of a diffusion from the conductive pad to the bonding layer is greater than a diffusion coefficient of a diffusion from the bonding layer to the conductive pad.

7. The micro-bonding structure of claim 1, further comprising a first adhesive layer between the conductive pad and the substrate.

8. The micro-bonding structure of claim 1, further comprising a second adhesive layer between the micro device and the bonding layer.

9. The micro-bonding structure of claim 1, further comprising at least one electrode between the bonding layer and the micro device.

10. The micro-bonding structure of claim 1, wherein a lateral length of the micro device is equal to or smaller than 50 μm.

11. The micro-bonding structure of claim 1, wherein a vertical length of one of the voids is less than or equal to 200 nm.

12. The micro-bonding structure of claim 1, wherein a surface roughness of one of the conductive pad and the bonding layer is less than or equal to 80 nm.

13. The micro-bonding structure of claim 1, wherein an area of the conductive pad is less than or equal to 2500 μm$^2$.

14. The micro-bonding structure of claim 1, wherein the bonding layer is a patterned bonding layer comprising at least two isolated portions, and the isolated portions are electrically isolated from one another.

15. The micro-bonding structure of claim 1, wherein the micro device comprises:
a first type semiconductor layer;
an active layer on the first type semiconductor layer; and
a second type semiconductor layer on the active layer.

16. The micro-bonding structure of claim 15, further comprising a filling material on the substrate and in contact with the conductive pad, the bonding layer, and the micro device, wherein a height of the filling material with respect to the substrate is greater than a height of the active layer with respect to the substrate, and smaller than a height of the micro device with respect to the substrate.

17. A method of forming a micro-bonding structure, comprising:
forming a bonding layer on the micro device, wherein a thickness of the bonding layer ranges from about 0.2 μm to about 2 μm;
preparing the substrate with a conductive pad thereon;
forming a liquid layer on the conductive pad;

placing the micro device over the substrate and contacting the micro device with the liquid layer; and heating at least one of the bonding layer and the conductive pad to a temperature below a melting point of one of the bonding layer and the conductive pad having lower melting point with a heating rate less than or equal to about 12 degree Celsius per minute to gradually evaporate the liquid layer, so that the bonding layer is in contact with the conductive pad to form a plurality of voids between the bonding layer and the conductive pad, and an interstitial diffusion occurs between the bonding layer and the conductive pad to form a diffusive bonding portion.

18. The method of claim 17, further comprising:

applying an external pressure to the conductive pad and the bonding layer such that the conductive pad and the bonding layer is suffered from a compressive pressure to enhance a bonding strength between the conductive pad and the bonding layer.

19. The method of claim 17, wherein the diffusive bonding portion is formed within an environment with a reducing gas therein.

* * * * *